United States Patent [19]

Buis

[11] Patent Number: 4,872,358

[45] Date of Patent: Oct. 10, 1989

[54] DRIVING MECHANISM HAVING A PRESSURE MEMBER

[75] Inventor: Edwin J. Buis, Veldhoven, Netherlands

[73] Assignee: U.S. Philips Corporation, New York, N.Y.

[21] Appl. No.: 161,527

[22] Filed: Feb. 29, 1988

[30] Foreign Application Priority Data

Jun. 11, 1987 [NL] Netherlands .......................... 8701360

[51] Int. Cl.$^4$ ............................................. F16H 25/18
[52] U.S. Cl. ...................................... 74/99 R; 74/107
[58] Field of Search ................ 74/99 R, 107, 567, 569

[56] References Cited

U.S. PATENT DOCUMENTS

| | | | |
|---|---|---|---|
| 2,674,904 | 4/1954 | Dickson | 74/573 |
| 3,199,359 | 8/1965 | Beezer | 74/569 X |
| 3,424,279 | 1/1969 | Frigger | 74/99 R X |
| 3,469,660 | 9/1969 | Mathers | 74/107 X |
| 3,997,033 | 12/1976 | Bulmer | 74/107 X |

Primary Examiner—Leslie A. Braun
Assistant Examiner—Janice E. Chartoff
Attorney, Agent, or Firm—Brian J. Wieghaus

[57] ABSTRACT

A driving mechanism having a driving shaft, which is rotatable about a first axis and on which a pressure member is located. The pressure member has a first roller segment which engages a fixed support and a second roller segment which engages an adjustment member. The adjustment member can be coupled to a load displaceable parallel to a second axis. The driving mechanism is particularly suitable for comparatively small and accurate displacements of a load, such as, for example, a mask table in an opto-lithographic apparatus.

30 Claims, 3 Drawing Sheets

DRIVING MECHANISM HAVING A PRESSURE MEMBER

BACKGROUND OF THE INVENTION

The invention relates to a driving mechanism having a driving shaft rotatable about a first axis, to which a pressure member or cam is connected. The pressure member enages an adjustment member or cam follower, which is displaceable along a second axis at right angles to the first axis in that the adjustment member and the pressure member are relatively rolled off.

In a driving mechanism of the kind mentioned in the opening paragraph known from U.S. Pat. No. 2674904, the pressure member consists of an eccentric cam on a driving shaft supported in bearings on either side of the cam. The cam engages a roller rotatable in an adjustment member. The adjustment member is coupled to a load. A pressure force is exerted by the cam between the two bearings on the roller. A disadvantage of the known driving mechanism is that a rigid construction resistant to bending can only be obtained at the expense of comparatively heavy component parts—such as a comparatively thick driving shaft—and a support of the driving shaft occupying a comparatively large amount of space.

SUMMARY OF THE INVENTION

The invention has for its object to provide a driving mechanism, in which the said disadvantage is avoided.

The driving mechanism according to the invention is for this purpose characterized in that the pressure member or cam engages a fixedly arranged support at the area of a first roller segment and engages the adjustment member or cam follower at the area of a second roller segment located opposite to the first roller segment rotation of the driving shaft about the first axis leads to a translation of the adjustment member along the second axis with a distance having a varying value. The amount of translation of the adjustment member is the distance between a first contact point of the pressure member and the support at the area of the first roller segment and a second contact point of the pressure member and the adjustment member at the area of the second roller segment when projected onto the second axis.

A further embodiment of the driving mechanism according to the invention, in which the pressure member can transfer comparatively great pressure forces to the adjustment member, is characterized in that the first and the second roller segment engage the support and the adjustment member, respectively, along a first and a second contact line parallel to the first axis.

A still further embodiment of the driving mechanism having a comparatively rigid compact pressure member that can be manufactured in a simple manner is characterized in that the first and the second roller segment are present on the pressure member.

Another embodiment of the driving mechanism, in which the so-called Hertzian stresses in the pressure member remain comparatively low, is characterized in that the first and the second roller segment, viewed in a plane transverse to the first axis, partly coincide with a cross-section of a first and a second circular cylinder having the same diameter as each other and a first and a second generatrix, respectively, which coincide with the first and the second contact line in a central position on the pressure member. The central position being the position of the pressure member halfway between the extreme maximum angular positions of the pressure member.

A further embodiment of the driving mechanism, in which a comparatively small angular rotation of the pressure member about the first axis leads to a comparatively large displacement of the adjustment member, is characterized in that the first generatrix coincides at the area of the first contact point between the pressure member and the support with the first axis in a central position of the pressure member.

A still further embodiment of the driving mechanism, in which a resetting force for the adjustment member is obtained in a simple manner, is characterized in that the adjustment member is tiltable about an axis parallel to the first axis.

A particular embodiment of the driving mechanism having a simple stroke limitation of the pressure member and a very small eccentricity without self-braking occurring in the case of contamination and/or wear is further characterized in that the pressure member has a parallelogram-shaped cross-section in a plane transverse to the first axis, the first roller segment being located at the area of one of the angular points of the said cross-section and the second roller segment being located opposite to the first roller segment at the area of a further angular point of the parallelogram-shaped cross-section.

A further embodiment of the driving mechanism provides a substantially linear relation between the rotation of the driving shaft and the translation of the adjustment member. For the embodiment in which the first and second roller segments partly coincide with a first and second circular cylinder having the same diameter as each other, the linear relationship can be obtained when the first and second circular cylinders are spaced such that the distance between the axis, when projected onto the direction of translation of the adjustment member, plus the diameter of the circular cylinders is larger than the diameter of the two circular cylinders when the relative position of the pressure member and the adjustment member is such that a first bisectrix plane of the first roller segment and a second bisectrix plane of the second roller segment are parallel to the direction of translation of the adjustment member.

BRIEF DESCRIPTION OF THE DRAWING

The invention will be described more fully with reference to the drawing, in which.

DESCRIPTION OF THE PREFERRED EMBODIMENTS

Figure 1:
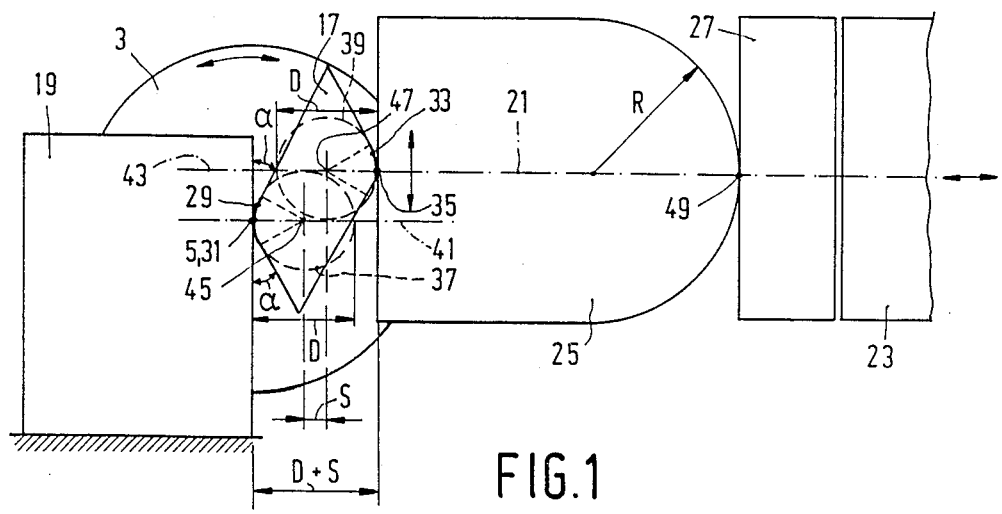
FIG. 1 shows diagrammatically in side elevation a first particular embodiment of the driving mechanism.
Figure 2:
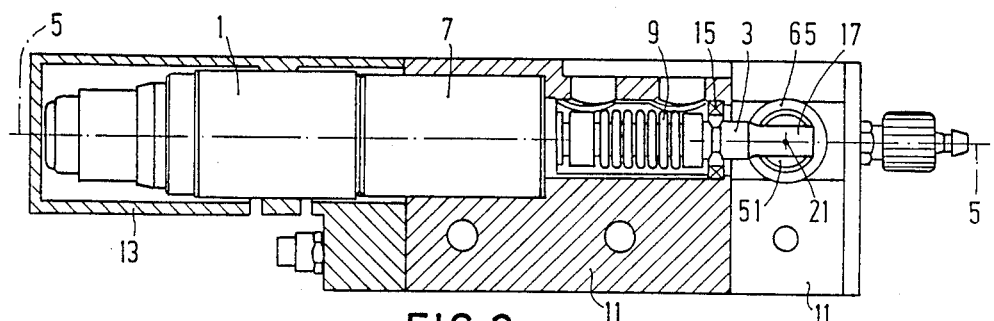
FIG. 2 is a longitudinal sectional view of the driving mechanism shown in FIG. 1.
Figure 3:
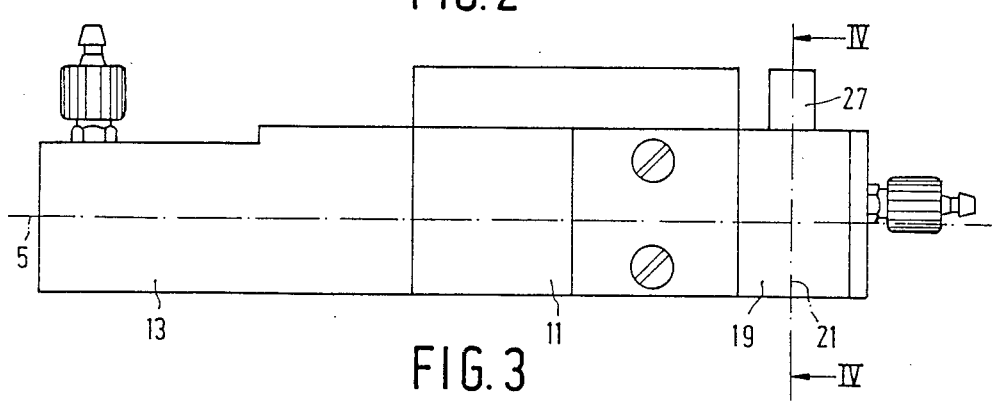
FIG. 3 is a plan view of the driving mechanism shown in FIG. 1.

The particular embodiment of the driving mechanism in the central position shown in FIGS. 1, 2, 3 and 4 has a driving shaft 3, which is coupled to an electric motor 1 and is rotatable about a first axis 5. The electric motor 1 is coupled to the driving shaft 3 via a delaying transmission 7 and a flexible bellows coupling 9. The assembly of the electric motor 1 and the transmission 7 is supported in a housing 11. The electric motor 1 is covered by a hood 13, which is secured to the housing 11. The driving shaft 3 is freely rotatable in a ball-bearing 15, which is mounted in the housing 11 and serves not for supporting the driving shaft 3, but for limiting any radial displacements of the driving shaft 3. The driving shaft 3 is therefore rotatable with a given radial clearance (0.1 mm) within the ball-bearing 15.

At the end remote from the electric motor 1 the driving shaft 3 has a pressure member or cam 17, which is integral therewith and engages by one side a fixedly arranged support 19, which is secured by means of a bolt 20 (cf. FIG. 4) to the housing 11, this pressure member exerting on an opposite side a pressure force directed parallel to a second axis 21 on a load 23. It should be noted that the pressure member 17 can exert in a more or less direct manner a pressure force on the load 23. In the embodiments of the driving mechanism shown in the Figures and described hereinafter, a pressure force is always concerned which is exerted via an adjustment member or cam follower 25 and a coupling member 27 on the load 23.

As appears from FIG. 1, the pressure member 17 has a first roller segment or cam surface 29 (partly indicated in dotted lines), which engages the support 19 at the area of a contact line 31 coinciding with the first axis 5 and a second roller segment 33 (partly indicated in dotted lines) engaging the adjustment member 25 at the area of a contact line 35. The contact lines 31 and 35 are curved planes and constitute the generatrices of a first circular cylinder 37 and a second circular cylinder 39, respectively. Both circular cylinders are indicated in FIG. 1 in dotted lines. Due to the fact that the contact points of the pressure member 17 on the support 19 and the adjustment member 25 are formed by a line or are strip-shaped, the elastic deformation of the pressure member 17, the support 19 and the adjustment member 25 caused by the pressure forces can remain comparatively small.

In the position of the pressure member 17 shown in FIG. 1, a first bisectrix plane 41 of the first roller segment 29 and a second bisectrix plane 43 of the second roller segment 33 extend in a plane at right angles to the plane of the drawing parallel to the second axis 21. The pressure member 17 is parallelogram-shaped, the roller segment 29 being located at the area of one of the angular points of the parallelogram and the roller segment 33 being located at the area of an angular point situated diagonally opposite thereto.

The distance between a first cylinder axis 45 of the first circular cylinder 37 and a second cylinder axis 47 of the second circular cylinder 39 projected onto the direction of translation of the load 23 (coinciding with the second axis 21 in the position shown in FIG. 1) is equal to S and the distance between the contact lines 31 and 35 projected onto the direction of translation of the load 23 is equal to S+D, where D is the diameter of the circular cylinders. The adjustment member 25 engages the coupling member 27 at the area of a contact point 49 located on the instantaneous tilting axis of the adjustment member 25 at right angles to the plane of the drawing.

The part of the adjustment member 25 facing the coupling member 27 has the form of a semi-sphere with a radius R. It is assumed that a resetting force is exerted on the load 23, for example by a spring. The load 23 may be an object table supported by blade springs.

The driving mechanism described above is intended for a maximum angular rotation $\alpha$ of the driving shaft 3 about the first axis 5. In the extreme angular positions of the driving shaft 3, the parallelogram sides of the pressure member 17 form a stroke limitation for the driving shaft 3. As a result, the maximum translation distance from the load 23 is therefore also determined.

The driving mechanism shown in FIG. 1 has the advantage that by means of the adjustment member 25 tiltable about the axis passing through the contact point 49 a resetting force is obtained which sets the adjustment member to the central position shown in FIG. 1, in which an equilibrium of forces prevails.

Due to the distance S between the cylinder axes 45 and 47 in the central position of the pressure member 17, a tiltable adjustment member 25 also affords the advantage of a substantially linear relation between the angular rotation of the driving shaft 3 and the translation of the load 23. Such a linear relation permits of obtaining a comparatively simple control loop with proportional linear control members. The positioning accuracy of the load 23 is thus considerably increased. In the present case, with an angular rotation of $\pm 0.1$ radians of the driving shaft 3 a translation of the load 23 of about 120 $\mu$m $\pm 00.2$ $\mu$m can be obtained.

Figure 4:
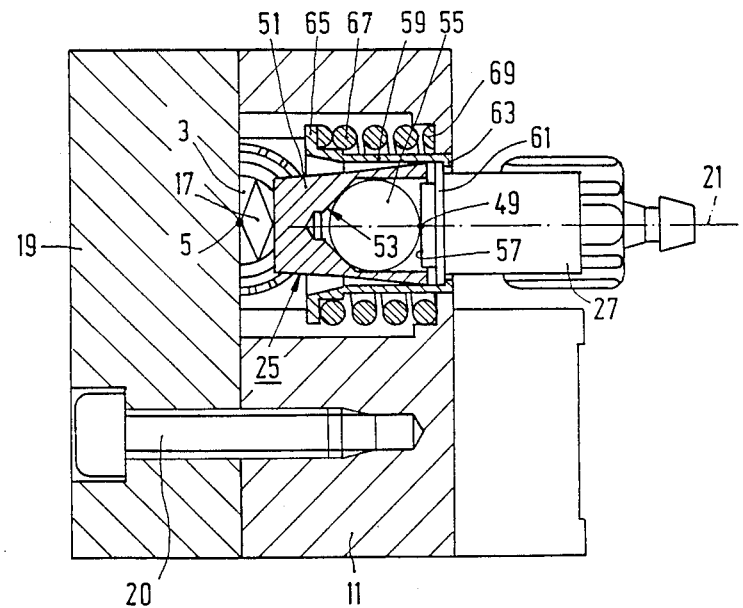
FIG. 4 shows on an enlarged scale a cross-section taken on the line IV—IV in FIG. 3.

As appears from FIG. 4, in a particular embodiment of the driving mechanism, an adjustment member 25 is used having a hat-shaped tiltable holder 51 provided with a conical edge 53 engaged on one side by a ball 55. The ball 55 engages by its other side a roller surface 57 of the coupling member 27. Such a radial clearance in the form of a wedge is present between the holder 51 and a sleeve 59 surrounding it such that the holder 51 can be tilted with respect to the sleeve 59.

The coupling member 27 is provided with a shoulder 61, behind which is hooked an edge 63 of the sleeve 59. The sleeve 59 has an annular flange 65, which engages one of the end faces of a helical spring 67. The helical spring 67 engages by its other end face an annular supporting surface 69 of the housing 11.

Due to the pressure force of the pre-stressed spring 67, any clearance in the driving train constituted by the pressure member 17, the holder 51, the ball 55 and the coupling member 27 is prevented. In the driving mechanism free of clearance, upon rotation of the driving shaft 3, the first roller segment 29 accurately rolls off over the fixedly arranged support 19 and the second roller segment 33 accurately rolls off over the adjustment member 25.

Figure 5:
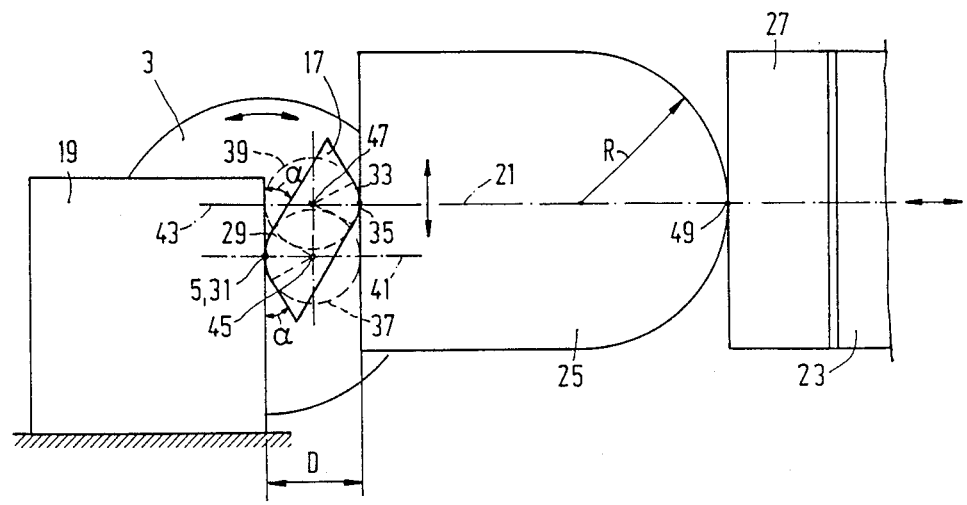
FIG. 5 shows diagrammatically in side elevation a second embodiment of the driving mechanism.

In the second embodiment of the driving mechanism according to the invention, shown in the central position in FIG. 5, reference numerals corresponding to those in FIGS. 1 to 4 are used as far as possible. The pressure member 17 is shown in FIG. 5 in the so-called central position for comparison with FIG. 1. It is clear that the distance between the contact lines 31 and 35 projected onto the second axis 21 or the direction of translation of the adjustment member 25 is equal to the diameter D of the circular cylinders 37 and 39. This results in that no substantially linear relation exists between the angular rotation of the driving shaft 3 and the translation distance from the load 23. In a large number of applications, however, this is not objectionable. The principle of the reaction force of the fixedly arranged support occurring at the area at which the force is transferred also applies to this case. The combination of the adjustment member 25 and the coupling member 27 is constructed as shown in FIG. 4 and is therefore shown only diagrammatically.

Figure 6:
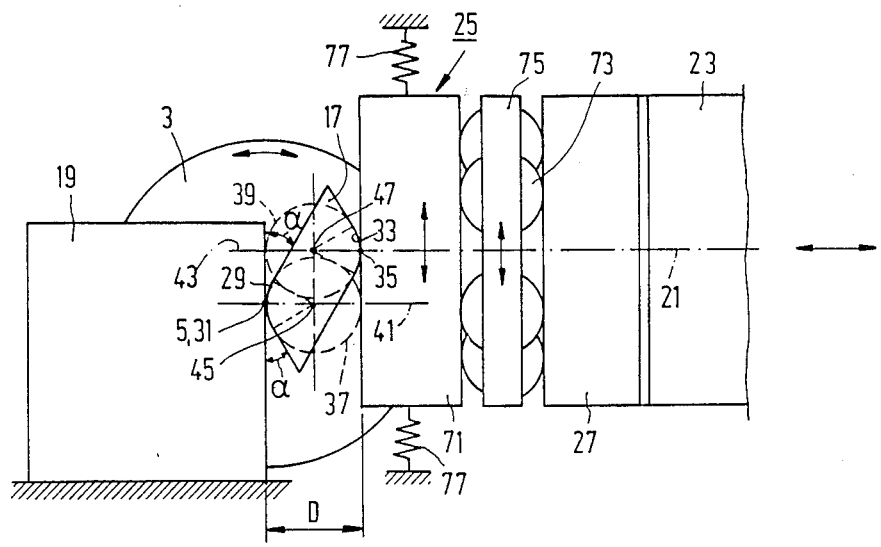
FIG. 6 shows diagrammatically in side elevation a third embodiment of the driving mechanism.

The third embodiment of the driving mechanism in the central position shown in FIG. 6 is also provided with reference numerals corresponding to those of the preceding Figures. The adjustment member 25 comprises a block 71 engaging on one side along the contact line 35 the pressure member 17 and on the other side ball bearings 73 enclosed in compartments of a usual bearing ring 75. The balls 73 further engage the coupling member 27. By means of springs 77, the required resetting force of the adjustment member 25 constituted by the block 71, the ball bearings 73 and the bearing ring 75 is obtained. The bearing ring 75 is displaced at half the speed of the block 71.

The pressure member 17 can be provided with parallelogram sides having a comparatively large radius of curvature. Thus, the advantage is obtained of a weakened impact near the end of the stroke of the pressure member 17.

Although in the foregoing use has always been made of a line contact between the pressure member 17 and the support 19 and the adjustment member 25, respectively, a point contact or a collection of point contacts is also possible. It is only essential that the cooperating surfaces of the pressure member 17, of the support 19 and of the adjustment member 25 can roll off over each other. Therefore, it is possible to transfer the roller segments 29 and 33 to the support 19 and the adjustment member 25, while the pressure member 17 is given a rectangular cross-section, which engages curved surfaces of the support 19 and the adjustment member 25 at the area of the long side of the rectangle. The axis of rotation 5 need not necessarily pass through the point of engagement of the roller segment 29 with the support 19, although it is thus prevented in a simple manner that slip occurs between the support 19 and the pressure member 17.

In the three embodiments described, the second axis 21 is perpendicular not only to the first axis 5 (perpendicular crossing), but also to the facing surfaces of the support 19 and of the adjustment member 25. It is possible that the second axis 21 and the direction of translation of the load 23 enclose an angle with the said surfaces of the support and of the adjustment member. The admissible angle depends upon the required load of the drive and the friction coefficients of the cooperating materials. In general, an angle is preferred which is smaller than 0.1 radians.

With the driving mechanisms described, a construction is obtained which— when compared with eccentric mechanisms— has an extremely small eccentricity without a self-braking effect occurring. This is even the case if dust is present on the cooperating surfaces, for example due to wear. The construction is compact and has a comparatively small mass inertia. Due to the fact that the force is transferred in the plane of the reaction forces of the support, a very rigid construction is obtained. The cooperating surfaces of the support, the pressure member and the adjustment member can be provided with guides with roller balls or roller cylinders. With a number of applications, the larger dimensions of such a construction are not objectionable. The driving mechanisms described above have a construction in which the journalling of the shaft 3 is no longer determinative of the rigidity of the drive. In this respect, the driving shaft and the pressure member are consequently effectively decoupled.

The driving mechanisms described are particularly suitable for driving mask tables in optolithographic apparatuses used in the manufacture of integrated circuits. Displacements in the so-called submicron range are possible with the driving mechanism inter alia due to the very high rigidity and the very low friction in the construction.

What is claimed is:

1. A driving mechanism, comprising:
    an elongate shaft defining a shaft axis, said shaft being rotatable through a predetermined angle about said shaft axis;
    a portion of said shaft defining a cam, said cam portion having first and second opposing surfaces;
    a cam follower displaceable along a second axis generally at right angles to said shaft axis and positioned for engaging said cam portion of said shaft, said cam follower having a surface in contact with said second surface of said cam portion; and
    support means positioned against said cam portion of said shaft on the side of said shaft opposite said cam follower for preventing displacement of said cam portion in a direction parallel to said second axis and in the direction away from said cam follower, said support means having a surface against which said first cam surface bears;
    said first cam surface and said surface of said support means being shaped for providing rolling contact with each other and defining a first roller segment, said first cam surface having a point which coincides with said shaft axis, and
    said second cam surface and said cam follower surface being shaped for providing rolling contact with each other and defining a second roller segment,
    upon rotation of said shaft and said cam portion, said cam portion in the area of said first roller segment being in rolling contact with said support means, and said cam portion in the area of said second roller segment being in rolling contact with said cam follower, and
    said rotation of said cam portion advancing said cam follower along said second axis a distance dependent on the angle of rotation of said shaft and said cam portion, the amount of translation being equal to the distance between a first point of contact between said first cam surface and said support means surface and a second point of contact between said second cam surface and said cam follower surface when projected onto said second axis.

2. A driving mechanism as claimed in claim 1 wherein said first and second surfaces of said cam portion, said surface of said support means, and said cam follower surface extend parallel to said shaft axis, said first cam surface and said second cam surface contacting said support surface and said cam follower surface, respectively, to define first and second contact lines parallel to said first axis.

3. A driving mechanism as claimed in claim 21, wherein said support surface and said cam follower surface are planar, and said first and second cam surfaces define curved planes for providing rolling contact with said planar support surface and cam follower surface, respectively.

4. A driving mechanism as claimed in claim 3, wherein said cam portion has a shape which defines two extreme angular positions of said cam portion, an angular position of said cam portion equidistant between said two extreme angular positions defining a central position of said cam portion, and the first and the second roller segments viewed in a plane transverse to the first axis partly coincide with a cross-section of a first and a second circular cylinder having the same diameter as each other and a first and a second generatrix, respectively, coinciding with the first and the second contact line in said central position of said cam portion.

5. A driving mechanism as claimed in claim 4, wherein the first generatrix coincides at the area of the first contact point between said cam portion and said support with the first axis in said central position of said cam portion.

6. A driving mechanism as claimed in claim 1, wherein said cam follower is tiltable about an axis parallel to said shaft axis.

7. A driving mechanism as claimed in claim 1, wherein said cam follower is displaceable in a direction at right angles to said shaft and said second axis.

8. A driving mechanism as claimed in claim 4 wherein said cam portion has a parallelogram-shaped cross-section in a plane transverse to the first axis, the first roller segment being located at the area of one of the angular points of the said cross-section and the second roller segment being located opposite to the first roller segment at the area of a further angular point of the parallelogram-shaped cross-section.

9. A driving mechanism as claimed in claim 8, wherein with a relative position of said cam portion and said cam follower in which a first bisectrix plane of the first roller segment and a second bisectrix plane of the second roller segment are parallel to the first and the second axis, the sum of the values of the distance between a first cylinder axis of the first circular cylinder and a second cylinder axis of the second circular cylinder projected onto the direction of translation and of the diameter of the circular cylinder is larger than the diameter of the two circular cylinders.

10. A driving mechanism as claimed in claim 1, wherein said support surface and said cam follower surface are planar, and said first and second cam surfaces define curved planes for providing rolling contact with said planar support surface and said cam follower surface respectively.

11. A driving mechanism as claimed in claim 10, wherein said cam portion has a shape which defines two extreme angular positions of said cam portion, an angular position of said cam portion equidistant between said two extreme angular positions defining a central position of said cam portion, the first and the second cam surfaces, viewed in a plane transverse to the first axis, partly coincide with a cross-section of a first and a second circular cylinder having the same diameter as each other and a first and a second generatrix, respectively, coinciding with the first and the second contact line in said central position of said cam portion.

12. A driving mechanism as claimed in claim 2, wherein said cam portion has a shape which defines two extreme angular positions of said cam portion, an angular position of said cam portion equidistant between said two extreme angular positions defining a central position of said cam portion; the first and the second cam surfaces, viewed in a plane transverse to the first axis, partly coincide with a cross-section of a first and a second circular cylinder having the same diameter as each other and a first and a second generatrix, respectively, coinciding with the first and the second contact line in said central position of said cam portion.

13. A driving mechanism as claimed in claim 12, wherein the first generatrix coincides at the area of the first contact point between said cam portion and the support with the first axis in said central position of said cam portion.

14. A driving mechanism as claimed in claim 11, wherein the first generatrix coincides at the area of the first contact point between said cam portion and the support with the first axis in said central position of said cam portion.

15. A driving mechanism as claimed in claim 1, wherein said cam follower is displaceable in a direction at right angles to said shaft and said second axis.

16. A driving mechanism as claimed in claim 15, further comprising a coupling member engaging said cam follower, and said cam follower comprises a holder portion having an internal cavity with an opening on the side of said cam follower facing away from said cam follower surface, said internal cavity having a conical surface with its apex facing said cam follower surface, a ball within said cavity positioned against said conical surface and contacting said coupling member, said cam follower being rotatable on said ball in a plane parallel to said second axis for allowing said cam follower surface to be in rolling contact with said cam portion.

17. A driving mechanism as claimed in claim 6, wherein said cam portion has a parallelogram-shaped cross-section in a plane transverse to the first axis, the first roller segment being located at the area of one of the angular points of the said cross-section and the second roller segment being located opposite to the first roller segment at the area of a further angular point of the parallelogram-shaped cross-section.

18. A driving mechanism as claimed in claim 12, wherein with a relative position of the cam portion and the cam follower in which a first bisectrix plane of the first roller segment and a second bisectrix plane of the second roller segment are parallel to the shaft axis and the second axis, the sum of the values of the distance between a first cylinder axis of the first circular cylinder and a second cylinder axis of the second circular cylinder projected onto the second axis and of the diameter of the circular cylinder is larger than the diameter of the two circular cylinders.

19. A driving mechanism, comprising:
an elongate shaft defining a shaft axis, said shaft being rotatable through a predetermined angle about said shaft axis;
a portion of said shaft defining a cam, said cam portion having first and second opposing surfaces;
a cam follower displaceable along a second axis substantially at right angles to said shaft axis and axially positioned for engaging said cam portion of said shaft, said cam follower having a surface in contact with said second surface of said cam portion; and
a fixed support fixed adjacent said shaft on the side of said shaft opposite said cam follower, said support having a surface against which said first surface of said cam portion bears for preventing displacement of said cam portion in a direction parallel to said second axis and in the direction away from said cam follower, said first surface of said cam portion and said support surface being shaped for providing rolling contact with each other and defining a first roller segment, and said second surface of said cam portion and said cam follower surface being shaped for providing rolling contact with each other and defining a second roller segment, said cam follower being displaceable in a plane parallel to said second axis for allowing rolling contact between said cam follower surface and said second cam surface, upon rotation of said shaft and said cam portion, said first cam surface being in rolling contact with said support surface and said second cam surface being in rolling contact with said cam follower surface, said cam follower surface being displaced in a plane parallel to said second axis in the direction of rolling of said second cam surface, said rotation of said cam portion advancing said cam follower along said second axis in the direction away from said support a distance dependent on the angle of rotation of said cam portion, the amount of translation being equal to the distance between a first point of contact between said first cam surface and said support surface and a second point of contact between said second cam surface and said cam follower surface when projected onto said second axis.

20. A driving mechanism as claimed in claim 19, wherein said first and second surfaces of said cam portion, said support surface, and said cam follower surface extend parallel to said shaft axis, said first cam surface and said second cam surface contacting said support surface and said cam follower surface, respectively, to define first and second contact lines parallel to said first axis.

21. A driving mechanism as claimed in claim 20, wherein said support surface and said cam follower surface are planar, and said first and second cam surfaces define curved planes for providing rolling contact with said planar support surface and said planar cam follower surface, respectively.

22. A driving mechanism as claimed in claim 21, wherein said cam portion has a shape which defines two extreme angular positions of said cam portion with respect to said support and said cam follower, an angular position of said cam portion equidistant between said two extreme angular positions defining a central position of said cam portion, and the first and second cam surfaces, in a plane transverse to said shaft axis, partly coincide with a cross-section of a first and second circular cylinder having the same diameter as each other and a first and second generatrix, respectively, coinciding with said first and second contact line in said central position of said cam portion.

23. A driving mechanism as claimed in claim 22, wherein, with said cam portion in said central position, said first generatrix coincides with said shaft axis at the area of the first contact point between said first cam surface and said support surface.

24. A driving mechanism as claimed in claim 23, wherein said cam portion has a parallelogram-shaped cross-section in a plane transverse to the first axis, the first roller segment being located at the area of one of the angular points of the said cross-section and the second roller segment being located opposite to the first roller segment at the area of a further angular point of the parallelogram-shaped cross-section.

25. A driving mechanism as claimed in claim 24, wherein with a relative position of said cam portion and said cam follower in which a first bisectrix plane of the first roller segment and a second bisectrix plane of the second roller segment are parallel to the first and the second axis, the sum of the distance between the axis of the first and second circular cylinders when projected onto the direction of translation of the cam follower plus the diameter of the circular cylinder is larger than the diameter of the two circular cylinders.

26. A driving mechanism as claimed in claim 25, wherein said cam follower is tiltable about an axis parallel to said shaft axis.

27. A driving mechanism as claimed in claim 26, further comprising a coupling member engaging said cam follower, and said cam follower comprises a holder portion having an internal cavity with an opening on the side of said cam follower facing away from said cam follower surface, said internal cavity having a conical surface with its apex facing said cam follower surface, a ball within said cavity positioned against said conical surface and contacting said coupling member, said cam follower being rotatable on said ball in a plane transverse to said shaft axis and second axis for allowing said cam follower surface to be in rolling contact with said cam portion.

28. A driving mechanism as claimed in claim 25, wherein said cam follower is displaceable in a direction at right angles to said shaft axis and said second axis.

29. A driving mechanism as claimed in claim 19, wherein said cam follower is tiltable about an axis parallel to said shaft axis.

30. A driving mechanism as claimed in claim 19, wherein said cam follower is displaceable in a direction at right angles to said shaft axis and said second axis.

* * * * *